United States Patent [19]

Emori

[11] Patent Number: 4,748,350

[45] Date of Patent: May 31, 1988

[54] EMITTER-COUPLED LOGIC CIRCUIT

[75] Inventor: Shinji Emori, Urawa, Japan

[73] Assignee: Fujitsu Limited, Kawasaki, Japan

[21] Appl. No.: 105,443

[22] Filed: Oct. 2, 1987

Related U.S. Application Data

[63] Continuation of Ser. No. 825,685, Jan. 31, 1986, abandoned, which is a continuation of Ser. No. 738,890, May 29, 1985, abandoned, which is a continuation of Ser. No. 331,288, Dec. 16, 1981, abandoned.

[30] Foreign Application Priority Data

Dec. 20, 1980 [JP]  Japan .................. 55-180832

[51] Int. Cl.$^4$ .................. H03K 19/086; H03K 19/20
[52] U.S. Cl. .................. 307/566; 307/455; 307/318; 307/362
[58] Field of Search ............ 307/318, 566, 455, 555, 307/559, 561, 565, 297, 362

[56] References Cited

U.S. PATENT DOCUMENTS

| | | | |
|---|---|---|---|
| 3,106,646 | 10/1963 | Carter | 307/318 |
| 3,237,019 | 2/1966 | Fitzgerald | 307/565 |
| 3,258,680 | 6/1966 | Ward | 307/318 |
| 3,296,516 | 1/1967 | Paine, II et al. | 307/318 |
| 3,310,688 | 3/1967 | Ditkofsky | 307/318 |
| 3,474,264 | 10/1969 | Hughes | |
| 3,502,911 | 3/1970 | Lehman | 307/363 |
| 3,610,962 | 10/1971 | Meyer et al. | 307/559 |
| 3,660,691 | 5/1972 | Glawleschkoff et al. | 307/318 |
| 3,699,362 | 10/1972 | Jordan | 307/551 |
| 3,700,915 | 10/1972 | Marley | |
| 3,733,498 | 5/1973 | Watson | 307/297 |
| 3,746,892 | 7/1973 | Ogiso et al. | 307/297 |
| 3,755,693 | 8/1973 | Lee | 307/559 |
| 3,881,150 | 4/1975 | Gay | 307/297 |
| 3,902,806 | 9/1975 | Bober | 307/297 |
| 3,935,479 | 1/1976 | Andreasen et al. | 307/565 |
| 4,063,147 | 12/1977 | Hatanaka et al. | 307/318 |
| 4,086,503 | 4/1978 | Fox et al. | 307/318 |
| 4,249,091 | 2/1981 | Yamagiwa | 307/455 |
| 4,290,005 | 9/1981 | Arumugham | 307/318 |
| 4,404,477 | 9/1983 | Chao | 307/297 |

OTHER PUBLICATIONS

Der Fernmelde-Ingenieur, "ECL—Die Emitter-Gekoppelte", by G. Hanke, vol. 27, No. 7, Jul. 1973, pp. 7–10.

Primary Examiner—Stanley D. Miller
Assistant Examiner—Timothy P. Callahan
Attorney, Agent, or Firm—Staas & Halsey

[57] ABSTRACT

An emitter-coupled logic (ECL) circuit having a pull-down resistor and including a breakdown protecting structure. Such breakdown occurs in an input transistor for receiving input data when an excess reverse voltage is applied across the emitter and base of the input transistor. The breakdown protection structure preferably includes a constant-voltage regulating device which can always clamp the level of a reference voltage $V_{BB}$ to a suitable level higher than a low voltage $V_{EE}$ of a power source by the value of a constant voltage. The reference voltage $V_{BB}$ is usually applied to the base of another transistor which should be coupled, at respective emitters, with the input transistor by the representative emitters.

2 Claims, 3 Drawing Sheets

EMITTER-COUPLED LOGIC CIRCUIT

This is a continuation of co-pending application application Ser. No. 825,685 filed on Jan. 31, 1986 now abandoned, which is a continuation of U.S. application Ser. No. 738,890, filed May 29, 1985, now abandoned, which is a continuation of U.S. application Ser. No. 331,288, filed Dec. 16, 1981, now abandoned.

BACKGROUND OF THE INVENTION

1. Field of the Invention

The present invention relates to an ECL (emitter-coupled logic) circuit, more particularly, to an ECL circuit containing therein a breakdown protecting structure.

2. Description of the Prior Art

In general, an ECL circuit is a form of a current-mode logic circuit in which the emitters of two transistors are connected to a single current-carrying resistor in such a way that only one transistor conducts at a time. The logic state of the output depends on which transistor is conducting. There are various forms of ECL circuits. The present invention particularly refers to an ECL circuit which includes therein a so-called pull-down resistor at the input stage. As is known, the pull-down resistor is useful for positively setting the base voltage of an input transistor at a fixed level in a very simple way, when the input terminal of the ECL circuit is left in the open state. However, contrary to the above, because of the presence of the pull-down resistor, the ECL circuit has a shortcoming in that the above-mentioned input transistor is often left in a breakdown state when the voltage level of a low voltage power source ($V_{EE}$) is changed in order to achieve a commercially specified test or a conventional accelerated aging test. It should be noted that once the transistor is left in the above-mentioned breakdown state, the common-emitter static forward current transfer ratio, that is $h_{FE}$, of the transistor is considerably reduced, and accordingly the base current thereof is increased. It is also known that the transistor having such a reduced $h_{FE}$ can no longer operate at a high operating speed.

The aforesaid reduction of $h_{FE}$, due to the occurrence of the above-mentioned breakdown, is not so significant in the case of currently used transistors. This is because no such breakdown is expected to occur in currently used transistors. However, the reduction of $h_{FE}$, due to the occurrence of the beakdown, is serious in the case of transistors contained in the ECL circuit. The ECL circuit, as is widely known, is very useful for constructing high-speed operating logic gates. Accordingly, in the case of the transistors in the ECL circuit, the diffusion depth at the base of each of the transistors must be made considerably shallow so as to improve the frequency characteristic thereof. However, a base with such a shallow diffusion depth, in each transistor in the ECL circuit, cannot withstand the breakdown. Thereby, in the ECL circuit, the aforesaid reduction of $h_{FE}$ is liable to occur, which means that the base current of the input transistor increases. In addition, high-speed operation can no longer be attained because, as was previously explained, a transistor having a reduced $h_{FE}$ can no longer operate at a high operating speed.

SUMMARY OF THE INVENTION

Therefore, it is an object of the present invention to provide an ECL circuit which does not induce therein an occurrence of the breakdown phenomenon, and thereby the ECL circuit can maintain a high $h_{FE}$ although it is forced in a commercially specified test or an accelerated aging test.

BRIEF DESCRIPTION OF THE DRAWING

The present invention will be more apparent from the ensuing description with reference to the accompanying drawings wherein.

DESCRIPTION OF THE PREFERRED EMBODIMENTS

Figure 1:
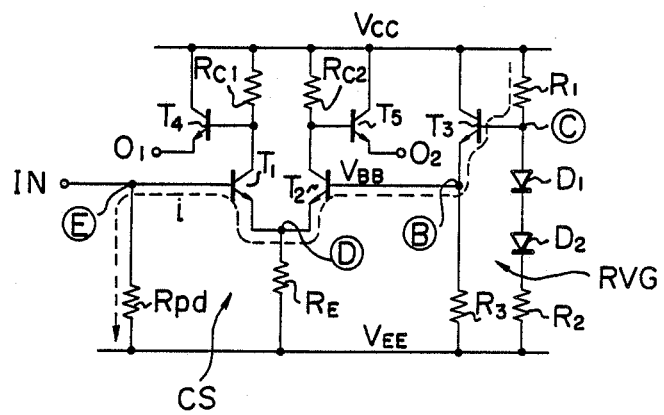
FIG. 1 is a circuit diagram of one example of a conventional ECL circuit.
Figure 2:
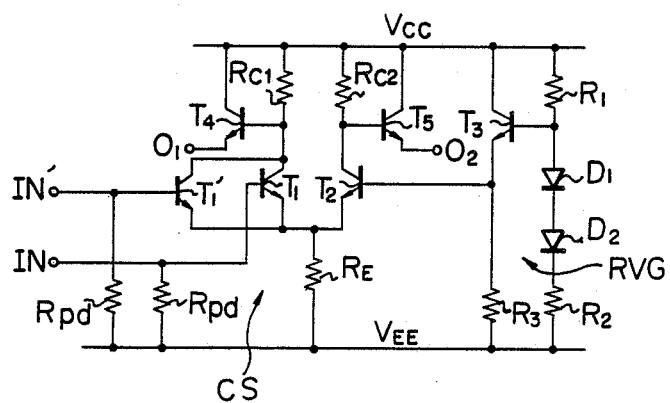
FIG. 2 is a circuit diagram of another example of an ECL circuit with respect to that of FIG. 1.

FIG. 1 is a circuit diagram of one example of a conventional ECL circuit. In this example, only one-input ECL NOR/OR gate is shown for facilitating the understanding of the present invention. If a two-input ECL is required, a further transistor is added to the ECL circuit of FIG. 1, as shown in FIG. 2. FIG. 2 is a circuit diagram of another example of an ECL circuit with respect to that of FIG. 1. In FIG. 2, two transistors, $T_1$ and $T_1'$, are located in the ECL circuit at its input stage, which transistors are provided at their respective bases with input terminals for receiving input data IN and IN', respectively.

Returning to FIG. 1, a current switch CS forms a major portion of the ECL circuit. In the ECL circuit having such a current switch CS, the aforementioned pull-down resistor $R_{pd}$ is currently employed at the input terminal for receiving the input data IN. The resistor $R_{pd}$ functions to set the base voltage of a first transistor $T_1$ at a low voltage level, especially in a case where the input terminal (IN) is open. The resistance value of the resistor $R_{pd}$ may be, for example, on the order of 50 k$\Omega$, and the resistor $R_{pd}$ is connected between the base of the transistor $T_1$ and the low voltage power source ($V_{EE}$), as shown in FIG. 1.

The first transistor $T_1$, together with a second transistor $T_2$, forms the current switch CS. The first and second transistors $T_1$ and $T_2$ are connected, on the one hand, to collector resistors $R_{c1}$ and $R_{c2}$, respectively, and on the other hand, to a common emitter resistor $R_E$. According to one example, the resistance value of the resistor $R_E$ is for example, 700$\Omega$, and the resistance values of the resistors $R_{c1}$ and $R_{c2}$ are for example, 250$\Omega$. The common emitter resistor $R_E$ may be substituted for a constant-current regulated source circuit, if necessary. The reference symbols $T_4$ and $T_5$ represent output transistors which produce output data $O_1$ and $O_2$, respectively. Since these transistors $T_4$ and $T_5$ form so-called emitter follower (EF) stages, the ECL circuit having both the aforesaid current switch CS and the emitter follower EF is usually called a CS-EF type ECL circuit. Such CS-EF type ECL circuit is usually driven by a high voltage power source and a low voltage power source. The voltage level of the former is defined as $V_{cc}$ having, for example. 0 V (ground GND), while the voltage level of the latter is defined as $V_{EE}$ having, for example, $-5.2$ V.

The input data IN is first applied to the first transistor $T_1$ at its base. Then the voltage level of the data IN is compared with the level of reference voltage $V_{BB}$. The reference voltage $V_{BB}$ is applied to the base of the transistor $T_2$. According to the comparison between the levels of the data IN and the voltage $V_{BB}$, if a relationship exists, that is $V_{in} > V_{BB}$ (the symbol $V_{in}$ denotes the voltage of the input data IN), the transistor $T_1$ is turned ON. When the transistor $T_1$ becomes conductive, a current flows along a path, defined as $V_{cc} \to R_{c1} \to T_1 \to R_E \to V_{EE}$. Thereby, the output data $O_1$, produced by the transistor $T_4$, becomes a low level "L". At this time, since the other transistor $T_2$ is in the OFF State, the output data $O_2$, produced by the transistor $T_5$, becomes a high level "H". Thus, according to the ECL circuit of FIG. 2, the two-input (IN, IN') NOR ECL gate produces the resultant NORing output data $O_1$, and, alternatively, the two-input (IN, IN') OR ECL gate produces the resultant ORing output data $O_2$.

The aforementioned reference voltage $V_{BB}$ to be applied to the base of the transistor $T_2$ is generated by means of a reference voltage generator RVG. The reference voltage generator RVG, as merely one example, is comprised of transistor $T_3$, resistors $R_1$, $R_2$, $R_3$, and diodes $D_1$ and $D_2$. The diodes $D_1$ and $D_2$ act as temperature compensating devices. These members $R_1$, $R_2$, $D_1$ and $D_2$ determine a certain level between $V_{cc}$ and $V_{EE}$, at a portion Ⓒ. The voltage level at the portion Ⓒ determines the voltage level at a portion Ⓑ, by subtracting the voltage $V_{BE}$ of a transistor $T_3$, which level at the portion Ⓑ constitutes said reference voltage $V_{BB}$.

When the ECL circuit is operated under recommended operational conditions, such as, for example, $V_{cc} = 0$ V, $V_{BB} = -1.29$ V, and $V_{EE} = -5.2$ V, of course no problem occurs in the ECL circuit. However, as previously mentioned, once all the recommended operational conditions are not satisfied due to, for example, the conducting of a commercially specified test or a conventional accelerated aging test, the significant problem of the aforesaid breakdown phenomenon arises in the ECL circuit. To be more specific, when one of the above tests is conducted, the level of the voltage $V_{EE}$ is reduced to a level much lower than the recommended nominal level and, at the same time, the input terminal of the data IN is left in the open state. In this case, a current i flows along a path, defined as $V_{cc} \to R_1 \to$ Ⓒ $\to$ Ⓑ $\to$ Ⓓ $\to$ Ⓔ $\to R_{pd} \to V_{EE}$, where the symbols Ⓒ Ⓑ Ⓓ and Ⓔ represent the respective portions indicated by the same symbols in FIG. 1 (refer to the current path illustrated by the broken line). When such current i flows, the first transistor $T_1$ cannot withstand the reverse voltage across its emitter and base. When the transistor $T_1$ yields to the reverse voltage, the aforementioned breakdown phenomenon occurs. It should be understood that the term "breakdown" does not mean destruction of the transistor $T_1$; rather, it means the creation of an undesirable, non-linear I-V characteristic (I: current, V: voltage).

Figure 3:
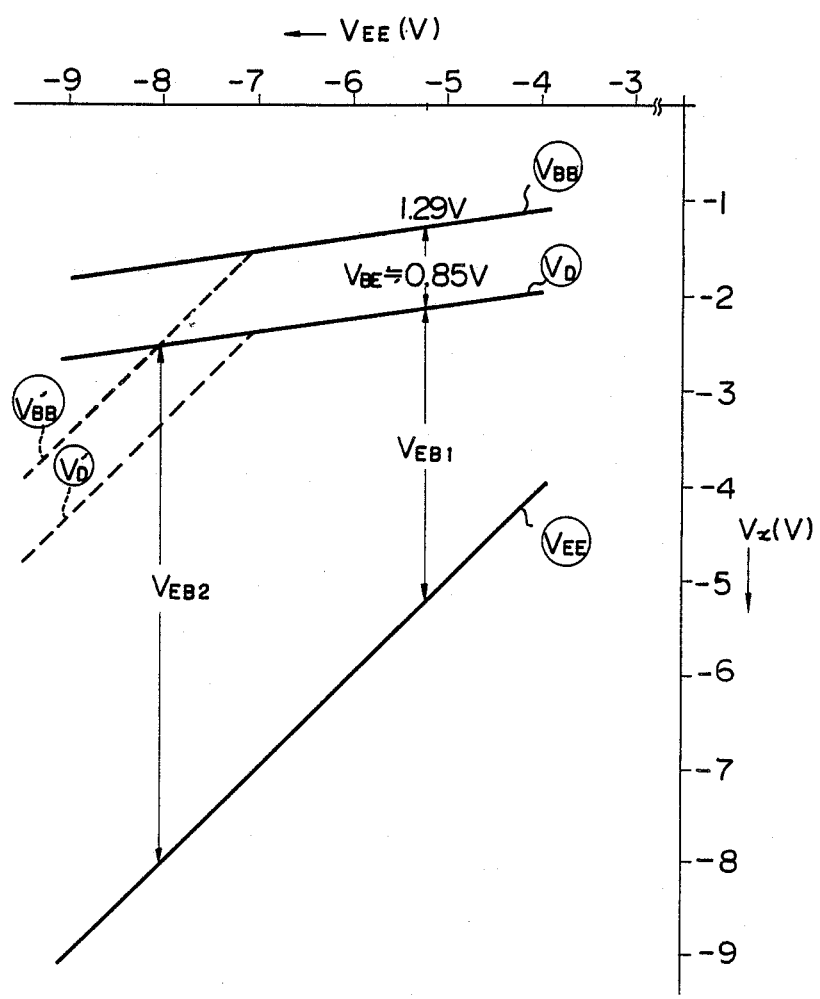
FIG. 3 is a graph used for explaining a basic concept of the present invention.

The invention will further be clarified with reference to FIG. 3. FIG. 3 is a graph used for explaining a basic concept of the present invention. The ordinate of the graph indicates the voltage $V_x$ (V) while the abscissa thereof indicates the voltage $V_{EE}$ (V). If one of the aforementioned tests is conducted, the level of the voltage $V_{EE}$ is reduced from $-5.2$ V to $-8$ V (refer to the line $\overline{V_{EE}}$), but the line $\overline{V_{EE}}$ in the graph shows a variation between $-4$ V and $-9$ V. When the level of the voltage $V_{EE}$ changes along the line $\overline{V_{EE}}$, the voltage level at the portion Ⓔ, corresponding to the base of the transistor $T_1$, also changes, via the pull-down resistor $R_{pd}$, in proportion to the change of $V_{EE}$.

On the other hand, the level of the reference voltage $V_{BB}$ does not change in proportion to the change of $V_{EE}$. This is because the changing ratio of the voltage $V_{BB}$ is made smaller by means of a voltage divider, comprising the members $R_1$, $D_1$, $D_2$ and $R_2$ in the generator RVG, when compared with the changing ratio of the voltage $V_{EE}$. This will be clarified, with reference to the graph of FIG. 3, in relation to a difference, regarding each gradient, between the line $\overline{V_{EE}}$ and the line $\overline{V_{BB}}$, indicating the change of the voltage $V_{BB}$. Thus, the difference voltage between the voltages $V_{BB}$ and $V_{EE}$ gradually increases when the level of the voltage $V_{EE}$ is pulled down further toward a low voltage such as $-8$ V.

The level of the voltage $V_D$ developed at the portion Ⓓ, that is the commonly connected emitters in the current switch CS, is always lower than that of the voltage $V_{BB}$ by the value of a base-emitter voltage $V_{BE}$ (about 0.85 V) of the second transistor $T_2$. Therefore, the line $\overline{V_D}$, indicating the above-mentioned voltage $V_D$, changes in parallel with the line $\overline{V_{BB}}$, maintaining a constant gap voltage of $V_{BE}$ ($\approx 0.85$ V) therebetween. Consequently, when the difference voltage between $V_{EE}$ and $V_D$, which voltage is applied as the reverse voltage $V_{EB}$ across the emitter and base of the transistor $T_1$, is increased and exceeds the difference voltage $V_{EB2}$ (refer to FIG. 3), the breakdown phenomenon occurs in the transistor $T_1$. The voltage $V_{EB2}$ is defined as being a breakdown voltage $BV_{EB0}$ which is typically about 5.5 V. The symbol $BV_{EB0}$ inidicates an emitter-base voltage (DC) when the collector is open.

With reference to the graph of FIG. 3, when the level of the voltage $V_{EE}$ is set at the recommended nominal value, such as $-5.2$ V, the aforesaid reverse voltage $V_{EB}$ of the transistor $T_1$, represented by the symbol $V_{EB1}$ in this graph, satisfies the following relationship:

$$V_{EB} = |V_{EB1}| < BV_{EB0} \approx 5.5 \text{ V}$$

Under such circumstances, no breakdown phenomenon is expected to occur because the transistor $T_1$ can fully withstand against such a small reverse voltage $V_{EB}$, which is smaller than the breakdown voltage $BV_{EB0}$ ($\approx 5.5$ V).

Contrary to the above, if the level of the voltage $V_{EE}$ is further reduced and exceeds $-8$ V, for example, the reverse voltage $V_{EB}$ of the transistor $T_1$, as represented by the symbol $V_{EB2}$ in this graph, satisfies the following relationship:

$$V_{EB} = |V_{EB2}| \geq BV_{EB0} \approx 5.5 \text{ V}$$

Under such circumstances, it is impossible to prevent the breakdown phenomenon from occurring in the transistor $T_1$. As previously explained, once the breakdown phenomenon occurs in the transistor $T_1$, the transistor cannot maintain an initial value of $h_{FE}$ and therefore the value of $h_{FE}$ is decreased. Such reduction of $h_{FE}$ creates a problem in that the base current of the transistor $T_1$ increases, accordingly, the transistor $T_1$ can not attain a high switching speed.

The present invention is effective for preventing the occurrence of the breakdown phenomenon. Returning again to the graph of FIG. 3, the characteristics regarding $V_{EE}$ vs $V_X$ are improved according to the present invention. The improvement is schematically illustrated by the broken lines $V'_{BB}$ and $V'_D$, where the broken lines $V'_{BB}$ and $V'_D$ are bent so as to follow the gradient of the line $V_{EE}$ when the level of the difference voltage exceeds that of a certain difference voltage within a range between the voltages $V_{EB1}$ and $V_{EB2}$. To be more specific, the change of the reference voltage $V_{BB}$ is clamped to be analogous to the change of the voltage $V_{EE}$. In this case, the present invention can actually be realized by taking into consideration the fact that although it is not preferable to change the level of the reference voltage within so wide a range, no problem will arise if the voltage change is produced outside the ordinarily permitted range of $V_{EE}$. For example, the voltage change of $V_{EE}$ is allowed to occur to the amount of $\pm 10\%$ with respect to the nominal voltage of $-5.2$ V.

Figure 4:
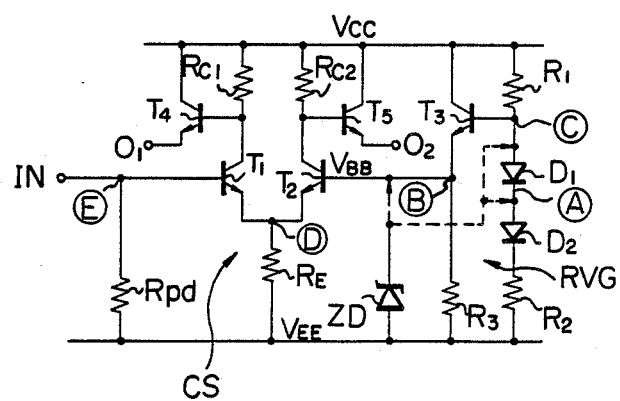
FIG. 4 is a circuit diagram showing one embodiment of the ECL circuit according to the present invention.

FIG. 4 is a circuit diagram showing one embodiment of the ECL circuit according to the present invention. The members represented by the same reference symbols as those of FIG. 1, are identical to each other. The ECL circuit employs therein a breakdown protecting means. The breakdown protecting means operates so as to shift the level of the output voltage ($V_{BB}$) from the reference voltage generator RVG in proportion to the change of the level of the voltage $V_{EE}$. Specifically, the breakdown protecting means comprises a constant-voltage regulating device. In FIG. 4, the constant-voltage regulating device is a zener diode ZD. The anode of the diode ZD is connected to the $V_{EE}$ line while the cathode of the diode ZD may be connected to one of suitable portions. First, the cathode may be connected, at a portion neighboring the portion ⒷⒷ, to the output of the reference voltage generator RVG; second, the cathode may be connected to a portion situated inside the generator RVG, for example a portion neighboring the portion ⒸⒸ or a portion ⒶⒶ. Of these portions, it is preferable to connect the cathode to the portion neighboring the portion ⒸⒸ or ⒶⒶ rather than to connect it to the portion neighboring the portion ⒷⒷ. The reason for this is simple. The impedance created at the portion ⒷⒷ is lower than the impedance created at the portion ⒸⒸ or ⒶⒶ. It should be noted that if the impedance created at the cathode of the diode ZD is relatively high, the diode ZD can easily maintain a regulated constant voltage without a large current flowing through it. Furthermore, it is preferable to connect the cathode of the diode ZD to the portion ⒶⒶ rather than to connect it to the portion ⒸⒸ because the voltage level, to be clamped by the diode ZD, is higher at the portion ⒸⒸ than the voltage level at the portion ⒶⒶ by the value of the forward voltage of the diode $D_1$. If the cathode of the diode ZD is connected to the portion ⒸⒸ, the bending point at the cross point, in FIG. 3, between the lines $V_{BB}$ and $V'_{BB}$ (also the lines $V_D$ and $V'_D$) is shifted to the right, while if connected with the portion ⒶⒶ, the bending point is shifted to the left.

Consequently, as will be apparent from the graph of FIG. 3, in one case where the level of the voltage $V_{EE}$ is set at a nominal value, such as $-5.2$ V, the reference voltage $V_{BB}$ (and the voltage $V_D$) is defined as the level subjected to the line $V_{BB}$ (and the line $V_D$), indicated by the solid line, while, in the other case where the level of the voltage $V_{EE}$ is set at a low value, such as about $-8$ V, the reference voltage $V_{BB}$ (and the $V_D$) is defined as the level subjected to the line $V'_{BB}$ (and the $V'_D$), indicated by the broken line. It is very important to know that the reverse voltage $V_{EB}$ of the transistor $T_1$ can no longer reach the breakdown voltage $V_{EB2}$ because the difference voltage between the solid line $V_{EE}$ and the broken line $V'_D$ is fixed at a certain voltage which is lower than the voltage $V_{EB2}$ but higher than the voltage $V_{EB1}$.

The zener voltage of the diode ZD is preferably the same as or lower than the voltage $BV_{EB0}$ across the emitter and base of the transistor $T_1$. Therefore, it is necessary to fabricate the diode ZD in a manufacturing process which is the same as the manufacturing process for forming the first transistor $T_1$. It should be recognized that in an integrated circuit (IC) there is no difficulty in introducing such a simple diode ZD into the integrated ECL circuit. However, such diode ZD should not be connected at its cathode to the portion ⒹⒹ. If the diode is so connected, a high-speed switching operation of the transistors $T_1$ and $T_2$ cannot be expected because the parasitic capacitor of the diode ZD is deleterious to achieving a high-speed switching operation.

As mentioned above in detail, the ECL circuit of the present invention is free of the problem of the voltage $V_{EE}$ exceeding the nominal voltage, due to a test, for example.

I claim:

1. An emitter-coupled semiconductor integrated logic circuit, comprising:
    power source means for providing a normal operating voltage, a high voltage power at a voltage of $V_{CC}$ and low voltage power at a voltage of $V_{EE}$;
    reference voltage generator means driven by said power source means for generating a reference voltage $V_{BB}$ and including a voltage dividing resistor circuit having an output node;
    a current switching including:
        a first transistor and a second transistor, said first transistor receiving input data at its base and having an emitter-base breakdown voltage $V_{EB0}$, the base of said first transistor being connected, via a pull-down resistor, to the low voltage $V_{EE}$ of said power source means, said second transistor receiving the reference $V_{BB}$ at its base, said first and second transistors being commonly connected at their respective emitters and operatively connected to $V_{EE}$;
        a third transistor having an emitter connected to the base of said second transistor, a collector operatively connected to the high voltage $V_{CC}$, and a base connected to the output node of said voltage dividing resistor circuit; and
    protecting means, operatively connected to the low voltage and to the base of said third transistor, for controlling an emitter voltage of said first transistor such that the emitter-base voltage of said first transistor is maintained below said $V_{EB0}$, and including a zener diode connected between the low voltage $V_{EE}$ and one of the emitter of said third transistor, the output node of said voltage driving resistor circuit, and a portion between the low voltage $V_{EE}$ and the output node of said voltage dividing resistor circuit, a zener voltage ZD being higher than the voltage across said zener diode and lower than $V_{EB0}$ when the normal operating voltage is applied, said protecting means having a breakdown voltage $ZD \leq V_{EB0}$, and being operated when a predetermined voltage is impressed across said protection means, said zener diode clamping the reference voltage only when the low voltage $V_{EE}$ falls below the normal operating voltage.

2. An emitter-coupled logic circuit as set forth in claim 1, wherein said zener diode ZD is fabricated by a process whereby at least said first transistor is fabricated at the same time.

* * * * *